United States Patent [19]

Ikeda

[11] Patent Number: 4,739,139
[45] Date of Patent: Apr. 19, 1988

[54] MINIATURE SWITCH FOR MOUNTING ON PRINTED CIRCUIT BOARDS

[75] Inventor: Hiroshi Ikeda, Tokyo, Japan

[73] Assignee: Nihon Kaiheiki Industrial Company Ltd., Tokyo, Japan

[21] Appl. No.: 915,584

[22] Filed: Oct. 6, 1986

[30] Foreign Application Priority Data

Dec. 25, 1985 [JP] Japan .................. 60-198288[U]

[51] Int. Cl.⁴ .................................. H02B 1/08
[52] U.S. Cl. ............................. 200/294; 200/295; 200/284; 361/405
[58] Field of Search ............ 200/294, 296, 295, 292, 200/284, 276; 361/404, 405; 339/17 C, 176 MP

[56] References Cited

U.S. PATENT DOCUMENTS 2,796,499  6/1957  Barden et al. ............ 200/294
3,321,601  5/1967  Walterick, et al. ........ 200/296
4,535,534  8/1985  Ohashi et al. ............. 200/296
4,644,096  2/1987  Gutierrez et al. .......... 361/405

FOREIGN PATENT DOCUMENTS 403431   10/1969  Australia .................. 200/296
61-96418  6/1986  Japan .

Primary Examiner—Renee S. Luebke
Attorney, Agent, or Firm—Armstrong, Nikaido, Marmelstein & Kubovcik

[57]                ABSTRACT

Pin terminals projecting from a side of a switch housing are led out upon being arranged in one direction and in a plane parallel to the side of the switch housing, and distal end portions of the pin terminals are secured to a printed circuit board. This reduces the space needed for mounting the switch, facilitates the mounting of the switch on the printed circuit board and mounts the switch more reliably.

6 Claims, 4 Drawing Sheets

PRIOR ART Fig. 1
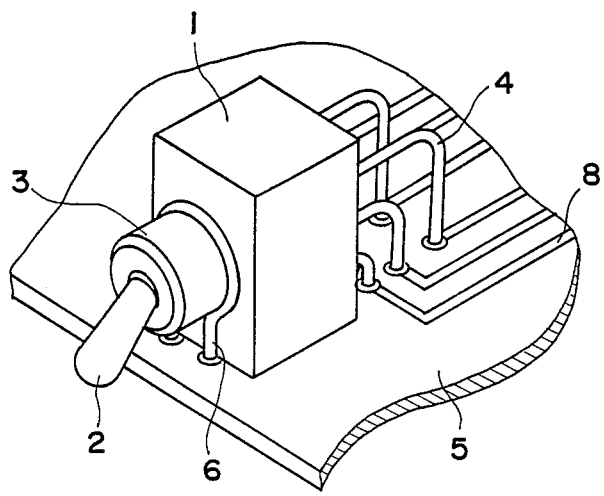
PRIOR ART Fig. 2
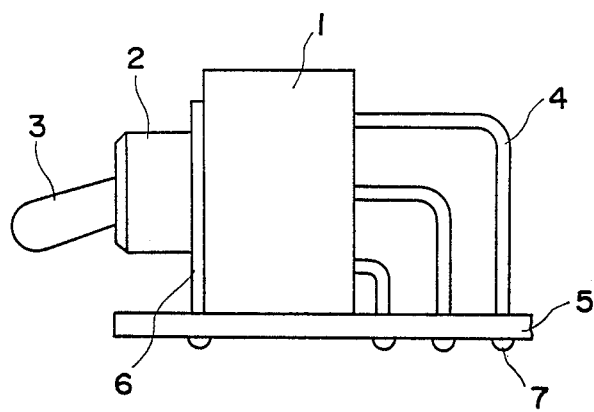

MINIATURE SWITCH FOR MOUNTING ON PRINTED CIRCUIT BOARDS

BACKGROUND OF THE INVENTION

This invention relates to a miniature switch that occupies little space, and which is capable of being readily mounted on a printed circuit board (hereafter referred to as a "circuit board").

In a case where a miniature switch is mounted directly on a circuit board, as shown in FIGS. 1 and 2, the bottom side of a switch housing 1 is provided with a plurality of outwardly projecting pin terminals 4 the ends of which are bent at a right angle so as to extend in parallel relation to the bottom side of the switch housing, and the tips of these bent terminals 4 are connected to wiring 8 formed on the circuit board 5. A mounting fixture 6 is engaged with a hollow cylindrical bushing 3 into which a toggle lever 2 is inserted, and both ends of the mounting fixture 6 are inserted into holes in the circuit board 5 and are soldered from the back side of the board to fix the switch housing 1 to the circuit board. To claim this art, the applicant has filed an application under U.S. Ser. No. 864,973 (official filing date: May 20, 1986) corresponding to Japanese Utility Model Application No. 59-181297 (filed on Nov. 29, 1984), which was laid open on June 20, 1986 as Japanese Utility Model Application No. 61-96418.

Depending upon the direction in which the toggle lever of the above-described miniature switch is manipulated, the switch is mounted vertically or horizontally. In particular, in an arrangement of the type in which the pin terminals are bent in a direction extending longitudinally of the switch housing to be connected to the wiring (which is the case shown in FIGS. 1 and 2), the pin terminals arranged vertically will extend rearwardly from the bottom side of the switch housing over some distance. This increases the area needed to mount the switch on the circuit board and is an obstacle to reducing the size of the apparatus equipped with the switch.

SUMMARY OF THE INVENTION

An object of the present invention is to provide a miniature switch for mounting on a circuit board, wherein pin terminals led out from one side of a switch housing are so arranged as to make possible a reduction in the space occupied by the switch.

Another object of the present invention is to provide a miniature switch for mounting on a circuit board, wherein the bottom side of a switch housing is so shaped, and the pin terminals led out from this side are so arranged, as to facilitate the mounting of the switch on the circuit board.

Still another object of the present invention is to provide a miniature switch for mounting on a circuit board, wherein mutually adjacent pin terminals are reliably insulated from each other and the pin terminals are prevented from being damaged by an externally applied force.

According to the present invention, the foregoing objects are attained by providing a miniature switch of the type having a switch housing and pin terminals led out from one side of the switch housing, characterized in that distal ends of the pin terminals are bent at generally right angles a required number of times and arrayed in a plane which is parallel to the one side of the switch housing, all of the bent distal ends of the pin terminals being arranged in one direction before being connected to a circuit board.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 1 is a perspective view illustrating a miniature switch for mounting on a circuit board in accordance with the prior art;

FIG. 2 is a side view illustrating the miniature switch of FIG. 1;

DESCRIPTION OF THE PREFERRED EMBODIMENTS

Preferred embodiments of the present invention will now be described in detail with reference to the drawings.

Figure 3:
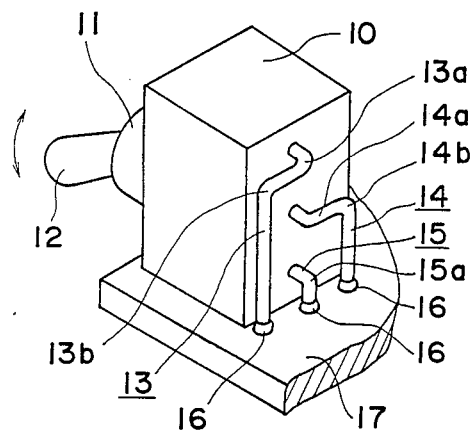
FIG. 3 is a perspective view illustrating a principal portion of a first embodiment of a miniature switch for mounting on a circuit board in accordance with the present invention.
Figure 4:
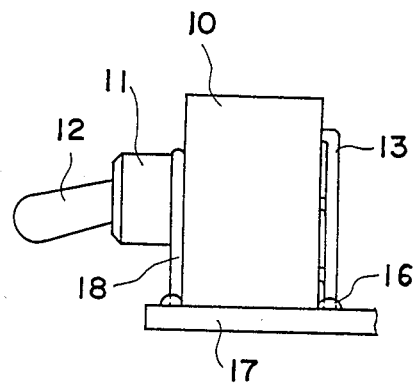
FIG. 4 is a side view illustrating the miniature switch of FIG. 3.

Reference will first be had to FIGS. 3 and 4 to describe a first embodiment of a miniature switch for mounting on a circuit board in accordance with the present invention.

The miniature switch includes a box-shaped switch housing 10 within which a switching mechanism is provided. The switch housing 10 has a front side equipped with a hollow bushing 11 in which a toggle lever 12 is inserted, and a back side projectively provided with a plurality of pin terminals 13, 14, 15 each comprising a wire made of a flexible material. The pin terminals can be integrally provided on a fixed contact (not shown) provided within the switch housing 10. The switch is mounted on a circuit board 17 by placing one side of the switch housing 10 on the circuit board 17, passing the pin terminals 13, 14, 15 through linearly arrayed apertures provided in wiring portions of the circuit board 17, and soldering the pin terminals to the wiring portions by solder 16. At the same time, a generally U-shaped mounting fixture 18 is fitted on the bushing 11, the two ends of the mounting fixture 18 are passed through apertures in the circuit board 17, and these ends of the fixture are soldered to the circuit board 17. In mounting the switch, each of the pin terminals 13, 14, 15 is bent substantially at a right angle at least once so as to lie parallel to the back side of the switch housing 10 and in such a manner that the pin terminals do not contact one another. More specifically, the pin terminal 13 is bent substantially at a right angle at two locations, namely at a first bend 13a and a second bend 13b, the pin terminal 14 is bent substantially at a right angle at two locations, namely at a first bend 14a and a second bend 14b, and the pin terminal 15 is bent substantially at a right angle only at one location, namely at a bend 15a. Since each pin terminal has the shape of a round rod, there is no limitation upon the bending direction and the pin can be bent in any direction and at any position. Accordingly, the clearance between the back side of the switch housing 10, namely the side from which the pin terminals project, and the apertures in the circuit board 17, as well as the pitch of the plural pin terminals, can be set at will. In addition, the isolating spacing between adjacent pin terminals can be optimally set. As a result, the designing task is facilitated since restricting conditions are reduced. Moreover, since the pin terminals can be bent at any position, a terminal once bent and set can be bent and set again if necessary. It is also possible to bend and set the pin terminals into an arrangement that will cooperate with the mounting fixture 18 to counteract an operating force applied to the toggle lever 12.

Adopting the above-described arrangement makes it possible to reduce the space needed for the wiring portions of the switch lead terminals.

Figure 5:
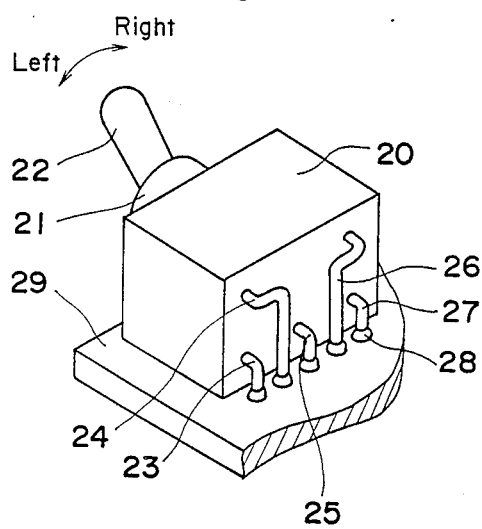
FIG. 5 is a perspective view illustrating a principal portion of a second embodiment of a miniature switch for mounting on a circuit board in accordance with the present invention.
Figure 6:
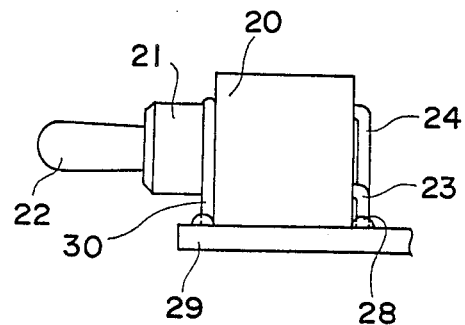
FIG. 6 is a side view illustrating the miniature switch of FIG. 5.

Let us now describe a second embodiment illustrated in FIGS. 5 and 6.

In the first embodiment, three pin terminals were provided. In this embodiment, a total of five pin terminals 23, 24, 25, 26, 27 are provided. A switch housing 20 is arranged sideways so that its length extends transversely, and a toggle lever is operated in a right-left direction. In other words, the arrangement is such that the toggle lever 22 is operated in a direction parallel to a circuit board 29. A bushing 21, solder 28 and mounting fixture 30 are similar to their counterparts in the first embodiment. By virtue of the added pin terminals 23, 27 at the outermost left and right sides, the force applied to operate the toggle lever 22 can be opposed to a greater extent than in the first embodiment, thus making it possible to mount the switch in a rigid manner.

A third embodiment of the invention shown in FIG. 7 will now be described.

A switch housing 40, bushing 41, toggle lever 42 and circuit board 49 are similar to their counterparts in the first embodiment.

In the third embodiment, pin terminals 43, 44, 45 are led out from the back side of the switch housing 40. This side of the housing is provided with a groove 46 in which the pin terminal 43 is disposed upon being bent, a groove 47 in which the pin terminal 44 is disposed upon being bent, and a groove 48 in which the pin terminal 45 is disposed upon being bent. The grooves 46, 47, 48 are provided at predetermined positions corresponding to the wiring portions of the pin terminals.

This arrangement reduces the spacing between mutually adjacent ones of the plural pin terminals while assuring a reliable isolation distance between them. This makes it possible to reduce the switch mounting space. Another advantage of this arrangement is that it prevents the pin terminals from being deformed by an externally applied force. The grooves 46, 47, 48 also serve to guide the respective pin terminals 43, 44, 45 when they are being bent.

Figure 7:
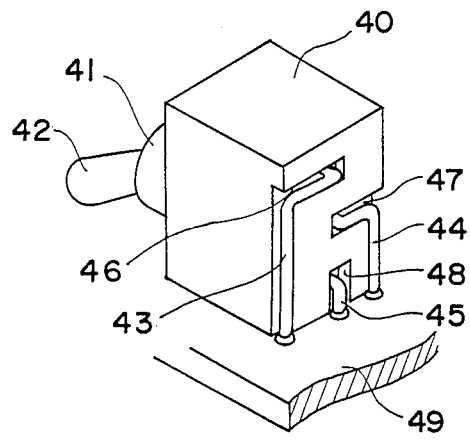
FIG. 7 is a perspective view illustrating a principal portion of a third embodiment of a miniature switch for mounting on a circuit board in accordance with the present invention.
Figure 8:
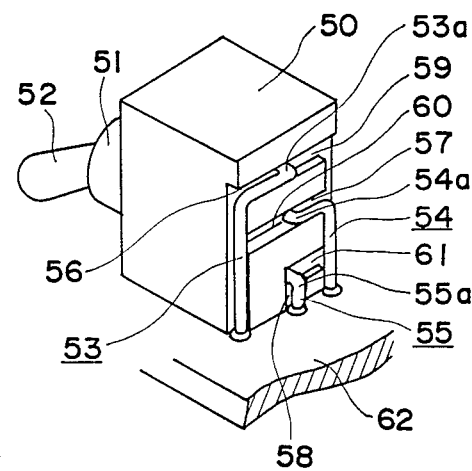
FIG. 8 is a perspective view illustrating a principal portion of a fourth embodiment of a miniature switch for mounting on a circuit board in accordance with the present invention.

A fourth embodiment of the present invention is depicted in FIG. 8. Here a switch housing 50, bushing 51, toggle lever 52, pin terminals 53, 54, 55, grooves 56, 57, 58 and circuit board 62 are similar to their counterparts in the third embodiment of FIG. 7.

In this embodiment, which is a modification of the third embodimet, the back side of the switch housing 50 is provided with a dummy groove 59 that enables the bending direction of the pin terminal 53 to be selected at a first bend 53a, a dummy groove 60 that enables the bending direction of the pin terminal 54 to be selected at a first bend 54a, and a dummy groove 61 that enables the bending direction of the pin terminal 55 to be selected at a first bend 55a.

Figure 9:
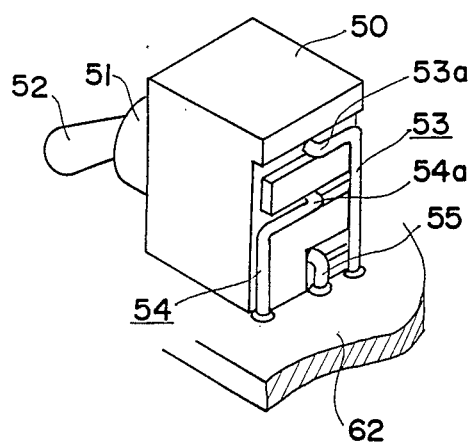
FIG. 9 is a perspective view illustrating an alternate arrangement of a fourth embodiment of a miniature switch for mounting on a circuit board in accordance with the present invention.
Figure 10:
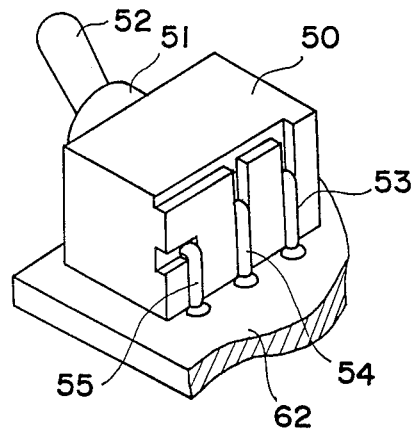
FIG. 10 is a perspective view showing the miniature switch of FIG. 9 mounted on a circuit board in a modification of the invention.

By comparing FIGS. 8 and 9, it will be seen that the pin terminals 53, 54 can be led out and connected to the circuit board 62 upon bending each of them in either of two directions at the first bends 53a, 54a, respectively. Further, the switch housing 50 can be arranged upright, as shown in FIG. 8, to effect the connection to the wiring on the circuit board, or on its side, as shown in FIG. 10, in which the pin terminals 53, 54, 55 are each bent downwardly once substantially at a right angle to make the connection to the wiring. Thus, the wiring of the pin terminals can be carried out so as to conform to the arrangement of the switch housing 50 and the wiring patterns on the circuit board 62. This makes it possible to greatly increase the degree of freedom in terms of wiring.

Figure 11:
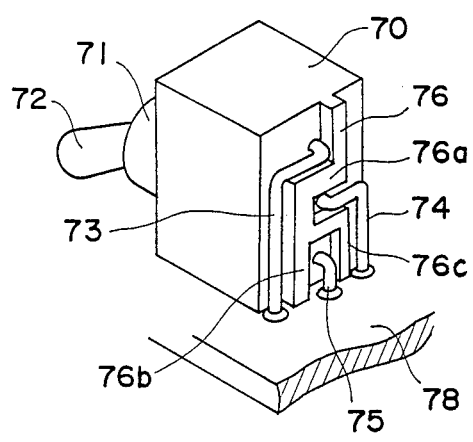
FIG. 11 is a perspective view illustrating a principal portion of a fifth embodiment of a miniature switch for mounting on a circuit board in accordance with the present invention.

Let us now describe a fifth embodiment of the invention shown in FIG. 11.

A switch housing 70, bushing 71, toggle lever 72, pin terminals 73, 74, 75 and circuit board 78 are similar to their counterparts in the third embodiment of FIG. 7.

In this embodiment, the spaces defined by the grooves 46, 47, 48 formed in the back side of the switch housing 40 of the third embodiment depicted in FIG. 7 are enlarged to form an isolating projection-like wall 76 to provide insulation between mutually adjacent ones of the pin terminals. More specifically, the back side of the switch housing 70 is formed to include a first projective wall portion 76a for separating the pin terminals 73 and 74, a second projective wall portion 76b for separating the pin terminals 73 and 75, and a third projective wall portion 76c for separating the pin terminals 74 and 75, these wall portions being interconnected to form the wall 76.

Figure 12:
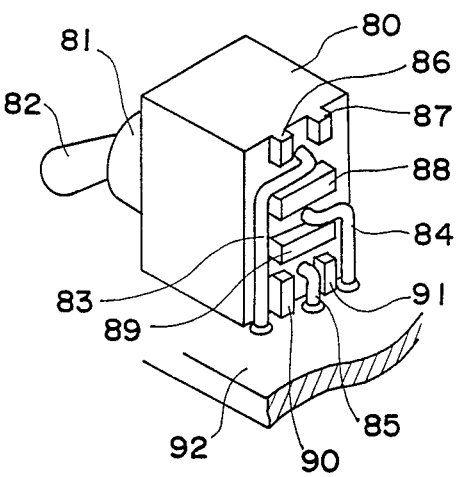
FIG. 12 is a perspective view illustrating a principal portion of a sixth embodiment of a miniature switch for mounting on a circuit board in accordance with the present invention.
Figure 13:
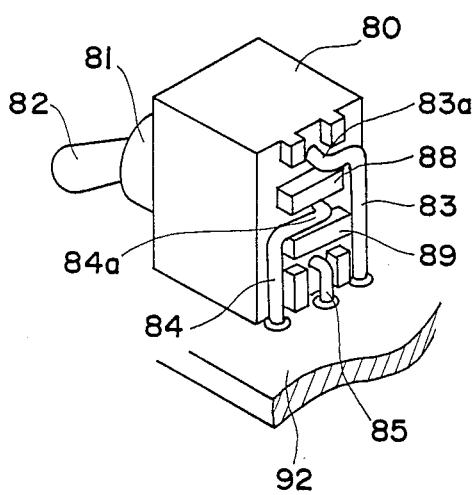
FIG. 13 is a perspective view showing the miniature switch of FIG. 12 mounted on a circuit board in a modification of the invention.
Figure 14:
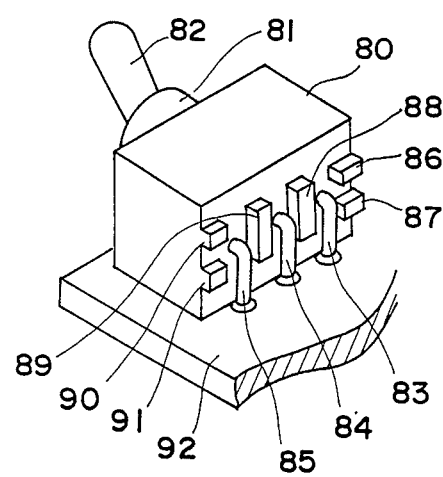
FIG. 14 is a perspective view showing the miniature switch of FIG. 12 mounted on a circuit board in another modification of the invention.

A sixth embodiment illustrated in FIGS. 12 through 14 will now be described.

A switch housing 80, bushing 81, toggle lever 82, pin terminals 83, 84, 85 and circuit board 92 are similar to their counterparts in the fifth embodiment of FIG. 11.

In this embodiment, the back side of the switch housing 80 is provided with isolating projections 86 through 91 obtained by reshaping and distributing the isolating projective wall 76 in the fifth embodiment of FIG. 11. This arrangement minimizes the area occupied by the projections and raises the degree of freedom in terms of the wiring of each pin terminal while maintaining the insulation between adjacent ones of the pin terminals. More specifically, the back side of the switch housing 80 is provided with the isolating projections 86, 87, which are spaced apart a prescribed distance with the pin terminal 83 located therebetween, for wiring the other pin terminals in parallel, the isolating projection 88 disposed between the pin terminals 83 and 84, the isolating projection 89 disposed between the pin terminals 84 and 85, and the isolating projections 90, 91, which are spaced apart a prescribed distance with the pin terminal 85 located therebetween, for wiring the other pin terminals in parallel.

Adopting this arrangement enables the bending direction at the first bends of predetermined pin terminals to be changed before the pin is led out and connected to the circuit board 92. For example, by comparing FIGS. 12 and 13, it will be seen that the pin terminals 83, 84 can be led out and connected to the circuit board 92 upon bending each of them in either of two directions at the first bends 83a, 84a, respectively. Further, the switch housing 80 can be arranged upright, as shown in FIG. 12, to effect the connection to the wiring on the circuit board, or on its side, as shown in FIG. 14, in which the pin terminals 83, 84, 85 are each bent downwardly once substantially at a right angle to make the connection to the wiring. Thus, the wiring of the pin terminals can be carried out so as to conform to the arrangement of the switch housing 80 and the wiring patterns on the circuit board 92. This makes it possible to greatly increase the degree of freedom in terms of wiring.

It should be noted that while the switches illustrated above are of the so-called "surface-mounted type" in which the switches are mounted by soldering the pin terminals to the patterned surface formed on the top surface of the circuit board, mounting can be carried out in the well-known conventional manner by providing holes in the circuit board, inserting the ends of the pin terminals and mounting fixture into the holes and soldering these ends on the back side of the circuit board.

The present invention is not limited to the above-described embodiments but can be modified in various ways without departing from the scope of the claims.

The present invention has the following advantages:

(1) The pin terminals can be arranged parallel to the side of the switch housing at any spacing and in a linear array, thus reducing the space needed for mounting.

(2) The switch can be mounted on the circuit board with ease.

(3) The invention can be applied to switches of the type wherein the direction in which the switch operating portion is manipulated is vertical or horizontal with respect to the circuit board, thus facilitating circuit board design.

(4) Since the pin terminals can be arranged on the circuit board at positions closer to the side from which the pin terminals are led out, any variance in terminal pitch can be eliminated.

(5) If necessary, the pitch of a plurality of terminals can be set at will.

(6) The optimum isolation spacing can be provided between mutually adjacent ones of a plurality of terminals.

(7) Since the pin terminals can be bent at any position, a terminal once bent and set can be bent and set again if necessary.

(8) It is possible to bend the pin terminals into a configuration that will cooperate with the mounting fixture to oppose an operating force applied to the toggle lever.

(9) In the case where the back side of the switch housing is provided with the grooves or projections, mutually adjacent pin terminals can be reliably isolated from each other. The terminals can be positively retained by being placed within the grooves. The grooves also serve as guides when the pin terminals are bent and function to protect the pin terminals from damage caused by an externally applied force.

What we claim is:

1. A miniature switch for mounting on a printed circuit board and having a switch housing, a switching mechanism arranged within the switch housing, and a plurality of pin terminals extending from a side of the switch housing, characterized in that at least three pin terminals are bent substantially at right angles a prescribed number of times with at least one pin terminal being bent at right angles more than once and are arranged to extend in one direction in a plane parallel to said side of the switch housing, distal end portions of said pin terminals being adapted to be secured to a printed circuit board.

2. A miniature switch for mounting on a printed circuit board and having a switch housing, a switching mechanism arranged within the switch housing, and pin terminals extending from a side of the switch housing, characterized in that grooves are formed in said side of the switch housing and said pin terminals are bent substantially at right angles a prescribed number of times and arranged within void spaces provided by said grooves and arranged to extend in one direction in a plane parallel to said side of the switch housing with distal end portions of said pin terminals adapted to be secured to a printed circuit board.

3. The miniature switch according to claim 2, wherein said grooves are arranged in such a manner that said pin terminals can be bent selectively to extend in any of a plurality of directions.

4. A miniature switch for mounting on a printed circuit board and having a switch housing, a switching mechanism arranged within the switch housing, and pin terminals extending from a side of the switch housing, characterized in that said side of the switch housing is provided with separating projections, said pin terminals are bent substantially at right angles a prescribed number of times and arranged to extend in one direction in a plane parallel to said side of the switch housing with distal end portions of said pin terminals being adapted to be secured to a printed circuit board and said separating projections are situated between mutually adjacent ones of said pin terminals.

5. The miniature switch according to claim 4, wherein said separating projections comprise separating projecting walls that are connected with one another between mutually adjacent ones of said pin terminals.

6. The miniature switch according to claim 4, wherein said separating projections are arranged in such a manner that said pin terminals can be bent selectively to extend in any of a plurality of directions.

* * * * *